United States Patent
Hu et al.

(10) Patent No.: US 10,283,576 B2
(45) Date of Patent: May 7, 2019

(54) ORGANIC LIGHT EMITTING DISPLAY SUBSTRATE IN WHICH LIGHT EMITTED FROM LIGHT EMITTING UNIT HAS INCREASED UNIFORMITY, MANUFACTURING METHOD THEREOF AND DISPLAY DEVICE

(71) Applicant: BOE TECHNOLOGY GROUP CO., LTD., Beijing (CN)

(72) Inventors: Chunjing Hu, Beijing (CN); Huaiting Shih, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/219,668

(22) Filed: Jul. 26, 2016

(65) Prior Publication Data
US 2017/0194395 A1    Jul. 6, 2017

(30) Foreign Application Priority Data

Jan. 4, 2016  (CN) .......................... 2016 1 0004846

(51) Int. Cl.
*H01L 27/32* (2006.01)
*H01L 51/00* (2006.01)
*H01L 27/12* (2006.01)

(52) U.S. Cl.
CPC ...... *H01L 27/3246* (2013.01); *H01L 51/0005* (2013.01); *H01L 27/1214* (2013.01); *H01L 27/3262* (2013.01)

(58) Field of Classification Search
CPC ............. H01L 27/3246; H01L 27/3262; H01L 27/1214
See application file for complete search history.

(56) References Cited

U.S. PATENT DOCUMENTS

2007/0075618 A1  4/2007 Mitsuya
2009/0194780 A1  8/2009 Kwon
(Continued)

FOREIGN PATENT DOCUMENTS

CN    101355097 A    1/2009

OTHER PUBLICATIONS

Chinese office action dated Jan. 10, 2018 for corresponding CN application No. 201610004846.1 with English translation attached.

*Primary Examiner* — Thanh T Nguyen
(74) *Attorney, Agent, or Firm* — Nath, Goldberg & Meyer; Joshua B. Goldberg

(57) ABSTRACT

An organic light emitting display substrate comprises a substrate, a first pixel defining layer provided on the substrate and a second pixel defining layer provided on the first pixel defining layer. The first pixel defining layer includes a plurality of first openings, and the second pixel defining layer includes a plurality of second openings in one-to-one correspondence with the plurality of first openings. An edge of each of the plurality of second openings extends outwards beyond an edge of the corresponding first opening so as to expose a portion of the first pixel defining layer, and a difference in length between each of the plurality of second openings and the corresponding first opening is greater than a difference in width between the second opening and the corresponding first opening.

20 Claims, 2 Drawing Sheets

(56) References Cited

U.S. PATENT DOCUMENTS

| | | | | |
|---|---|---|---|---|
| 2015/0060810 A1* | 3/2015 | Han | ................... | H01L 27/3246 257/40 |
| 2015/0380685 A1* | 12/2015 | Lee | ................... | H01L 51/5243 257/40 |
| 2016/0111688 A1* | 4/2016 | Lee | ................... | H01L 51/56 257/40 |

* cited by examiner

ORGANIC LIGHT EMITTING DISPLAY SUBSTRATE IN WHICH LIGHT EMITTED FROM LIGHT EMITTING UNIT HAS INCREASED UNIFORMITY, MANUFACTURING METHOD THEREOF AND DISPLAY DEVICE

CROSS-REFERENCE TO RELATED APPLICATIONS

The present application claims the priority of Chinese Patent Application No. 201610004846.1, filed on Jan. 4, 2016, the contents of which are incorporated herein in their entirety by reference.

FIELD OF THE INVENTION

The present invention relates to the field of organic light emitting device, and in particular, relates to an organic light emitting display substrate, a manufacturing method thereof and a display device.

BACKGROUND OF THE INVENTION

As shown in FIGS. 1 and 2, during manufacture of an organic light emitting display substrate, a pixel defining layer 1 with an opening is firstly formed on a base substrate, the opening and the base substrate forming an accommodation groove, and then ink is inkjet printed into the accommodation groove, wherein the ink forms a film layer 2, such as a hole transport layer, a light emitting layer, and the like, of a light emitting unit after drying.

During the drying of the ink to form a film layer, since a solvent of the ink mostly evaporates from the peripheral region of a layer of the ink, the ink will flows from the central region of the layer of the ink to the peripheral region. The flowage will allow a solute of the ink to move towards the peripheral region and to eventually deposit therein, so as to form the film layer 2 as shown in FIG. 2. A thickness of a peripheral region of the film layer 2 is greater than that of a central region of the film layer 2. After formation of various film layers of the light emitting unit, the light emitting effect of the light emitting unit is shown in FIG. 3. That is, a central region of the light emitting unit will be a bright display region, and a peripheral region (i.e., an annular region between a rectangular dotted line and a rectangular solid line adjacent to the rectangular dotted line, as shown in FIG. 1 or 3) of the light emitting unit will be a dark display region, this light emitting effect being referred to as a "coffee ring effect." Although FIG. 1 shows that, in the peripheral region of the film layer 2 which has a greater thickness, each of the peripheral portions at the upper and lower sides has a width d1 equal to a width d2 of each of the peripheral portions at the left and right sides, each of the dark regions formed at the upper and lower sides of the peripheral region as shown in FIG. 3 appears larger due to the fact that the upper and lower sides of the film layer 2 of the light emitting unit are shorter than the left and right sides thereof.

SUMMARY

In view of the above disadvantages existing in the prior art, an object of the present invention is to provide an organic light emitting display substrate, a manufacturing method thereof and a display device, wherein the organic light emitting display substrate and the display device have an improved display effect.

An embodiment of the present invention provides an organic light emitting display substrate which includes a substrate, a first pixel defining layer provided on the substrate and a second pixel defining layer provided on the first pixel defining layer, wherein the first pixel defining layer includes a plurality of first openings, the second pixel defining layer includes a plurality of second openings in one-to-one correspondence with the plurality of first openings, an edge of each of the plurality of second openings extends outwards beyond an edge of the corresponding first opening so as to expose a portion of the first pixel defining layer, and a difference in length between each of the plurality of second openings and the corresponding first opening is greater than a difference in width between the second opening and the corresponding first opening.

Optionally, the portion of the first pixel defining layer exposed by each of the plurality of second openings includes two first exposed portions located at two ends of the corresponding first opening in a length direction of the corresponding first opening, respectively, and two second exposed portions located at two ends of the corresponding first opening in a width direction of the corresponding first opening, respectively, wherein one of the two first exposed portions has a size in the length direction of the corresponding first opening greater than a size of any one of the two second exposed portions in the width direction of the corresponding first opening, and the other of the two first exposed portions has a size in the length direction of the corresponding first opening not less than the size of any one of the two second exposed portions in the width direction of the corresponding first opening.

Optionally, each of the two second exposed portions has a width ranging from 4 μm to 5 μm.

Optionally, the organic light emitting display substrate further includes a plurality of thin film transistors provided on the substrate, a passivation layer covering the plurality of thin film transistors and an electrode layer provided on the passivation layer, wherein the plurality of thin film transistors, the passivation layer and the electrode layer are all located between the first pixel defining layer and the substrate, the electrode layer includes a plurality of pixel electrodes, each of the plurality of first openings corresponds to one of the plurality of pixel electrodes and one of the plurality of thin film transistors, a via is provided in the passivation layer, and each of the plurality of pixel electrodes is connected to a drain electrode of the corresponding thin film transistor through the via; and wherein the via is located within an orthogonal projection region of one of the two first exposed portions onto the passivation layer.

Optionally, the first pixel defining layer includes a hydrophilic material, and the second pixel defining layer includes a hydrophobic material.

Optionally, the second pixel defining layer has a thickness greater than that of the first pixel defining layer.

Correspondingly, an embodiment of the present invention further provides a manufacturing method of an organic light emitting display substrate, including steps of:

forming a first pixel defining material layer;

performing a patterning process on the first pixel defining material layer so as to form a first pixel defining layer including a plurality of first openings;

forming a second pixel defining material layer; and performing a patterning process on the second pixel defining material layerso as to form a second pixel defining layer including a plurality of second openings, wherein the plurality of second openings are in one-to-one correspondence with the plurality of first openings, an edge of each of the plurality of second openings extends outwards beyond an edge of the corresponding first opening so as to expose a portion of the first pixel defining layer, and a difference in length between each of the plurality of second openings and the corresponding first opening is greater than a difference in width between the second opening and the corresponding first opening.

Optionally, the portion of the first pixel defining layer exposed by each of the plurality of second openings includes two first exposed portions located at two ends of the corresponding first opening in a length direction of the corresponding first opening, respectively, and two second exposed portions located at two ends of the corresponding first opening in a width direction of the corresponding first opening, respectively, wherein one of the two first exposed portions has a size in the length direction of the corresponding first opening greater than a size of any one of the two second exposed portions in the width direction of the corresponding first opening, and the other of the two first exposed portions has a size in the length direction of the corresponding first opening not less than the size of any one of the two second exposed portions in the width direction of the corresponding first opening.

Optionally, each of the two second exposed portions has a width ranging from 4 μm to 5 μm.

Optionally, prior to the step of forming a first pixel defining material layer, the manufacturing method further includes steps of;

forming a plurality of thin film transistors, wherein the plurality of thin film transistors are in one-to-one correspondence with the plurality of first openings; and forming a passivation layer having a via therein, wherein the via is located within an orthogonal projection region of one of the two first exposed portions onto the passivation layer.

Optionally, the first pixel defining material layer includes a hydrophilic material, and the second pixel defining material layer includes a hydrophobic material.

Optionally, the second pixel defining material layer has a thickness greater than that of the first pixel defining material layer.

Correspondingly, an embodiment of the present invention further provides a display device including the organic light emitting display substrate according to the present invention.

In the present invention, since an edge of each of the second openings extends outwards beyond an edge of the corresponding first opening, each of the second openings will expose a portion of the first pixel defining layer. Thus, in a case where a film layer of the light emitting unit in the accommodation groove has a greater thickness at its peripheral region than that at its central region, an area in which the peripheral region of the film layer is in contact with a portion of the pixel electrode thereunder can be reduced due to the portion of the first pixel defining layer exposed by each of the second openings, and a portion of the film layer which is not in contact with the pixel electrode will not emit light, thereby reducing a width of the dark region generated in the peripheral region of the film layer of the light emitting unit when the light emitting unit emits light. Further, since a difference in length between each of the second openings and the corresponding first opening is greater than a difference in width between the second opening and the corresponding first opening, a larger part of the peripheral portions of the film layer, which are close to the short sides of the accommodation groove, can be separated from the pixel electrode by each of the first exposed portions, thereby further reducing a width of the dark regions close to the short sides of the film layer of the light emitting unit and thus increasing uniformity of light emitted from the light emitting unit.

BRIEF DESCRIPTION OF THE DRAWINGS

The accompanying drawings, which constitute a part of the specification, are provided for a further understanding of the present invention, and for explaining the present invention together with the following embodiments, but not intended to limit the present invention. In the drawings.

DETAILED DESCRIPTION

Embodiments of the present invention will be described below in detail with reference to the accompanying drawings. It should be understood that, the embodiments described herein are only used for describing and explaining the present invention, but are not intended to limit the present invention.

Figure 4:
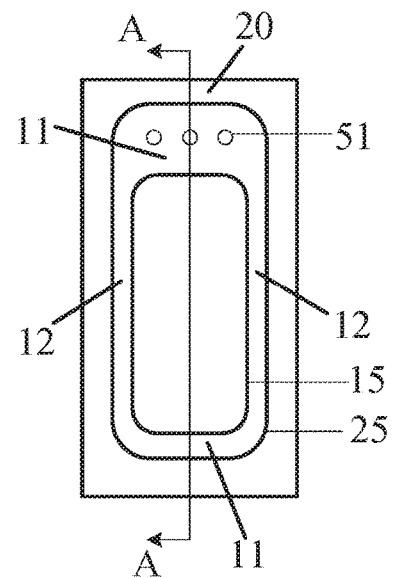
FIG. 4 is a top view showing a light emitting unit in an organic light emitting display substrate according to an embodiment of the present invention.
Figure 5:
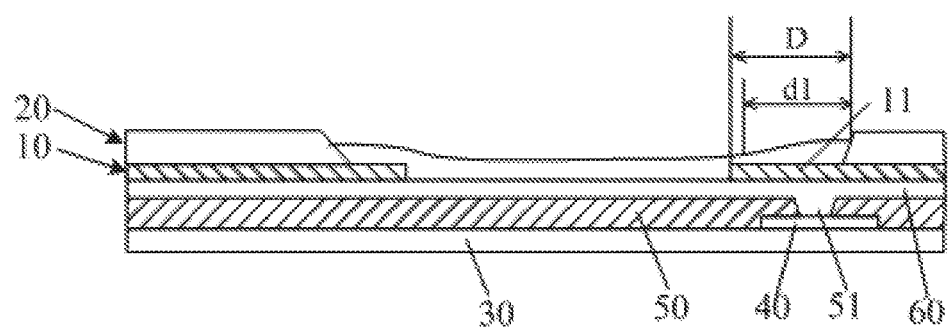
FIG. 5 is a sectional view showing the light emitting unit according to an embodiment of the present invention, taken along the line A-A as shown in FIG. 4.

An embodiment of the present invention provides an organic light emitting display substrate. As shown in FIGS. 4 and 5, the organic light emitting display substrate includes a substrate 30, a first pixel defining layer 10 provided on the substrate 30 and a second pixel defining layer 20 provided on the first pixel defining layer 10. The first pixel defining layer 10 includes a plurality of first openings 15, and the second pixel defining layer 20 includes a plurality of second openings 25 in one-to-one correspondence with the plurality of first openings 15. An edge of each of the plurality of second openings 25 extends outwards (i.e., along a direction away from the center of each of the plurality of second openings 25) beyond an edge of the corresponding first opening 15 so as to expose a portion of the first pixel defining layer 10, and a difference in length between each of the plurality of second openings 25 and the corresponding first opening 15 is greater than a difference in width between the second opening 25 and the corresponding first opening 15.

It should be understood that, the portion of the first pixel defining layer 10 exposed by each of the plurality of second openings 25 refers to a portion of the first pixel defining layer 10 which is located within each of the plurality of second openings 25. Each of the plurality of first openings 15, the corresponding second opening 25 and the substrate 30 may jointly define an accommodation groove for accommodating ink which is inkjet printed therein. The ink inkjet printed into the accommodation groove will form a film layer of a light emitting unit, such as a hole transport layer, a light emitting layer, and the like. A cathode and an anode may be provided above and under the light emitting unit, respectively. Electrons and holes will be generated when electrical signals are applied to the cathode and the anode, respectively, and will recombine in a light emitting layer such that light is emitted. Here, a light emitting area of the light emitting unit depends on an area of a portion, which is in contact with a pixel electrode 60 thereunder, of the film layer of the light emitting unit. That is, in a case where an edge of the pixel electrode 60 extend outwards beyond an edge of the corresponding first opening 15, the light emitting area of the light emitting unit is equal to an area of the bottom of the corresponding first opening 15.

Figure 1:
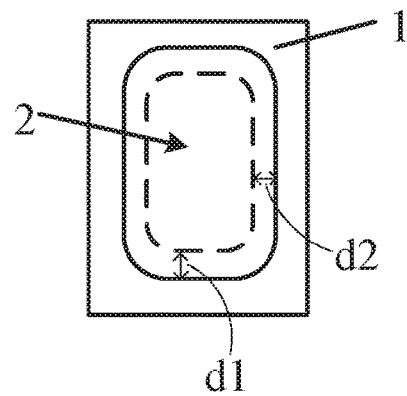
FIG. 1 is a top view showing a light emitting unit in an organic light emitting display substrate in the prior art.
Figure 2:
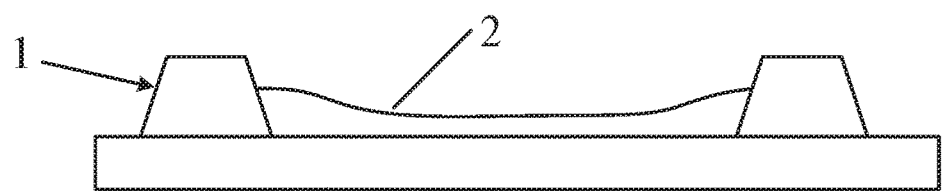
FIG. 2 is a sectional view showing the light emitting unit in the organic light emitting display substrate in the prior art.
Figure 3:
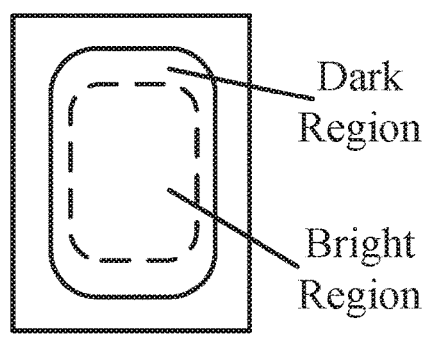
FIG. 3 is a schematic diagram showing the light emitting effect of the light emitting unit in the prior art.

In the light emitting unit in the prior art as shown in FIGS. 1 and 2, only a pixel defining layer 1 with an opening is formed on a substrate, and a light emitting area of the light emitting unit is equal to an area of the bottom of the opening in the pixel defining layer 1. In a case where a film layer of the light emitting unit has a greater thickness at its peripheral region than that at its central region, the brightness of the light emitting unit at its peripheral region will be lower than that at its central region. Further, as shown in FIG. 1, the peripheral region of the film layer with a greater thickness has an annular shape in which the width is uniform throughout each portion. That is, the peripheral portions at the upper and lower sides each has a width d1 equal to a width d2 of each of the peripheral portions at the left and right sides. However, as shown in FIG. 1, the upper and lower sides of the accommodation groove are shorter than the left and right sides thereof, and thus the dark regions formed in the peripheral portions at the upper and lower sides are more noticeable than those formed in the peripheral portions at the left and right sides when light is emitted. In other words, each of the dark regions formed in the peripheral portions at the upper and lower sides has a width greater than that of each of the dark regions formed in the peripheral portions at the left and right sides, as shown in FIG. 3.

In the present invention, after a film layer is formed by inkjet printing ink into the accommodation groove, a top surface of the film layer at its peripheral region is higher than that of the film layer at its central region, which is similar to the case as shown in FIG. 2. Further, in a case where the ink used herein is the same as that used in the prior art, widths of peripheral region of the film layer in the length and width directions of the film layer may be the same as the widths d1 and d2 as shown in FIG. 1, respectively. In the present invention, however, since an edge of each of the plurality of second openings 25 extends outwards beyond an edge of the corresponding first opening 15, each of the plurality of second openings 25 will expose a portion of the first pixel defining layer 10. Thus, in a case where the film layer, in the accommodation groove, of the light emitting unit in the accommodation groove has a greater thickness at its peripheral region than that at its central region, the portion of the first pixel defining layer 10 exposed by each of the second openings 25 can reduce an area in which the peripheral region of the film layer is in contact with a portion of the pixel electrode 60 thereunder and a portion of the film layer which is not in contact with the pixel electrode 60 will not emit light, thereby reducing a width of the dark region generated in the peripheral region of the light emitting unit when the light emitting unit emits light. Further, as shown in FIG. 4, since a difference in length between each of the second openings 25 and the corresponding first opening 15 is greater than a difference in width between the second opening 25 and the corresponding first opening 15, a larger part of the film layer, which is close to the short sides of the accommodation groove, can be separated from the pixel electrode by each of the exposed portions (i.e., first exposed portions 11) of the first pixel defining layer 10 exposed by each of the second openings 25 in its length direction, thereby further reducing a width of the dark regions close to the short sides of the film layer of the light emitting unit, and thus increasing uniformity of light emitted from the light emitting unit. It should be noted that, since the film layer is formed by inkjet printing ink into the accommodation groove, the short sides and the long sides of the film layer correspond to the short sides and the long sides of the accommodation groove, respectively.

An area of each first opening 15 of the present invention may be the same as that of the opening in the pixel defining layer 1 in the prior art, such that an aperture ratio of a pixel of a display substrate is ensured. In this case, the provision of the second pixel defining layer 20 of the present invention can increase a volume of the accommodation groove and thereby avoid ink overflow and crosscolor during inkjet printing.

Specifically, as shown in FIG. 4, the portion of the first pixel defining layer 10 exposed by each of the plurality of second openings 25 includes two first exposed portions 11 located at two ends of the corresponding first opening 15 in a length direction of the corresponding first opening 15, respectively, and two second exposed portions 12 located at two ends of the corresponding first opening 15 in a width direction of the corresponding first opening 15, respectively, wherein one of the two first exposed portions 11 (e.g., the first exposed portion 11 at the upper side as shown in FIG. 4) has a size (e.g., a width) in the length direction of the corresponding first opening greater than a size (e.g., a width) of any one of the two second exposed portions 12 in the width direction of the corresponding first opening 15, and the other of the two first exposed portions 11 has a size (e.g., a width) in the length direction of the corresponding first opening 15 not less than the size (e.g., a width) of any one of the two second exposed portions 12 in the width direction of the corresponding first opening 15. As shown in FIG. 4, the two first exposed portions 11 and the two second exposed portions 12 are connected to each other to form an annular structure.

It should be noted that, the greater the portion of the first pixel defining layer 10 exposed by each of the plurality of second openings 25, the larger an area of a portion, which does not emit light, of the film layer of the corresponding light emitting unit. To ensure high-resolution display of a display substrate, in the present invention, the two second exposed portions 12 have a same width, one of the two first exposed portions 11 has a width greater than that of each of the two second exposed portions 12, and the other of the two first exposed portions 11 has the same width as that of each of the two second exposed portions 12.

As shown in FIGS. 4 and 5, one of the two first exposed portions 11 has a greater size (e.g., width) in the length direction of the corresponding first opening 15, and thus when a film layer is formed in the accommodation groove, a width D of the said one of the two first exposed portions 11 in the length direction of the corresponding first opening 15 is greater than the width d1 of the peripheral region of the film layer. Thus, a portion of the film layer with the width D, which is close to an edge of the accommodation groove and includes the peripheral region having the width d1, is separated from the pixel electrode 60 so as to not emit light, and thus a corresponding dark region will not occur.

Optionally, each of the two second exposed portions 12 has a width ranging from 4 μm to 5 μm, such that uniformity of brightness of emitted light is increased while the display resolution is ensured.

Additionally, as shown in FIG. 5, the organic light emitting display substrate may further include a plurality of thin film transistors 40 provided on the substrate 30, a passivation layer 50 covering the plurality of thin film transistors 40 and an electrode layer provided on the passivation layer 50. The plurality of thin film transistors 40, the passivation layer 50 and the electrode layer are all located between the first pixel defining layer 10 and the substrate 30. The electrode layer includes a plurality of pixel electrodes 60, and each of the plurality of first openings 15 corresponds to one of the plurality of pixel electrodes 60 and one of the plurality of thin film transistors 40, A via 51 is provided in the passivation layer 50, and each of the plurality of pixel electrodes 60 is connected to a drain electrode of the corresponding thin film transistor 40 through the via 51. The via 51 may be located within an orthogonal projection region of one of the two first exposed portions 11 (e.g., the first exposed portion 11 having a greater width) onto the passivation layer 50.

For example, each of the pixel electrodes 60 may be made of a transparent material such as indium tin oxide (ITO) or the like. Generally, the via 51 is located outside an orthogonal projection region of the corresponding first opening 15 onto the passivation layer 50. That is, the via 51 is located within a region from which light is not emitted. In the present invention, each of the second openings 25 is enlarged, so that the via 51 is located within an orthogonal projection region of one of the two first exposed portions 11 (e.g., the first exposed portion 11 having a greater width) onto the passivation layer 50, thereby ensuring that the via 51 is located within a region from which light is not emitted. As a result, uniformity of light emitted from the light emitting unit is increased, while a resolution and an aperture ratio of the display substrate are ensured.

Optionally, the first pixel defining layer 10 includes a hydrophilic material such as silicon dioxide, and the second pixel defining layer 20 includes a hydrophobic material such as a hydrophobic photoresist. As a result, after ink is inkjet printed into the accommodation groove, the flowage of the ink from the central region of the layer of the ink to the peripheral region thereof is less occurred, thereby increasing the uniformity of width of the resultant film layer.

As shown in FIG. 5, the second pixel defining layer 20 has a thickness greater than that of the first pixel defining layer 10, such that a volume of the accommodation groove defined by each of the plurality of first openings 15, the corresponding second opening 25 and the corresponding pixel electrode 60 is increased, thereby avoiding ink overflow.

As an example of the film layer, a hole injection layer, a hole transport layer, a light emitting layer, an electron transport layer and an electron injection layer may be sequentially provided in the accommodation groove defined by each of the plurality of first openings 15, the corresponding second opening 25 and the corresponding pixel electrode 60.

Another embodiment of the present invention provides a manufacturing method of an organic light emitting display substrate. The manufacturing method includes steps of:

forming a first pixel defining material layer;

performing a patterning process on the first pixel defining material layer so as to form a first pixel defining layer 10 including a plurality of first openings 15;

forming a second pixel defining material layer; and performing a patterning process on the second pixel defining material layer so as to form a second pixel defining layer 20 including a plurality of second openings 25, wherein the plurality of second openings 25 are in one-to-one correspondence with the plurality of first openings 15, an edge of each of the plurality of second openings 25 extends outwards beyond an edge of the corresponding first opening 15 so as to expose a portion of the first pixel defining layer 10, and a difference in length between each of the plurality of second openings 25 and the corresponding first opening 15 is greater than a difference in width between the second opening 25 and the corresponding first opening 15.

Specifically, the portion of the first pixel defining layer 10 exposed by each of the plurality of second openings 25 includes two first exposed portions 11 located at two ends of the corresponding first opening 15 in a length direction of the corresponding first opening 15, respectively, and two second exposed portions 12 located at two ends of the corresponding first opening 15 in a width direction of the corresponding first opening 15, respectively, wherein one of the two first exposed portions 11 has a size (e.g., a width) in the length direction of the corresponding first opening 15 greater than a size of any one of the two second exposed portions 12 in the width direction of the corresponding first opening 15, and the other of the two first exposed portions 11 has a size in the length direction of the corresponding first opening 15 not less than the size of any one of the two second exposed portions 12 in the width direction of the corresponding first opening 15.

Further specifically, each of the two second exposed portions 12 has a width ranging from 4 μm to 5 μm.

Optionally, prior to the step of forming a first pixel defining material layer, the manufacturing method of an organic light emitting display substrate further includes steps of:

forming a plurality of thin film transistors 40 on a substrate 30, wherein the plurality of thin film transistors 40 are in one-to-one correspondence with the plurality of first openings 15; and forming a passivation layer 50 having a via 51 therein, wherein the via 51 is located within an orthogonal projection region of one of the two first exposed portions 11 (e.g., the first exposed portion 11 having a greater width) onto the passivation layer 50.

In the manufacturing method of an organic light emitting display substrate provided by the present invention, the first pixel defining material layer may include a hydrophilic material, and the second pixel defining material layer may include a hydrophobic material.

For example, the first pixel defining material layer may be an inorganic material layer such as a silicon dioxide layer or the like. In this case, the step of performing a patterning process on the first pixel defining material layer may include steps of: forming a photoresist layer on the first pixel defining material layer; next, exposing and developing the photoresist layer, so as to remove portions of the photoresist at positions where a plurality of first openings 15 are to be formed; thereafter, etching the first pixel defining material layer, so as to form the first pixel defining layer 10 including the plurality of first openings 15; and finally, removing the remaining photoresist. The second pixel defining material layer may be a hydrophobic photoresist layer, and the step of performing a patterning process on the second pixel defining material layer includes steps of: exposing and developing the second pixel defining material layer, so as to remove the second pixel defining material at positions where a plurality of second openings 25 are to be formed; and then etching the second pixel defining material layer, so as to form the second pixel defining layer 20 including the plurality of second openings 25.

Optionally, the second pixel defining material layer has a thickness greater than that of the first pixel defining material layer, such that a volume of the accommodation groove defined by each of the plurality of first openings 15, the corresponding second opening 25 and the corresponding pixel electrode 60 is increased.

Optionally, after the step of performing a patterning process on the second pixel defining material layer, the manufacturing method of an organic light emitting display substrate may further include a step of sequentially forming a hole injection layer, a hole transport layer, a light emitting layer, an electron transport layer and an electron injection layer in the accommodation groove defined by each of the plurality of first openings 15, the corresponding second opening 25 and the corresponding pixel electrode 60.

Here, the hole injection layer, the hole transport layer and the light emitting layer may be formed by inkjet printing, and the electron transport layer and the electron injection layer may be formed by vapor deposition.

Another embodiment of the present invention provides a display device including the organic light emitting display substrate according to the present invention.

In the organic light emitting display substrate, since the peripheral region of the film layer of the light emitting unit can be separated from the pixel electrode by the portion of the first pixel defining layer exposed by each of the second openings 25, a light emitting area, which corresponds to the peripheral region of the film layer, of the light emitting unit is reduced. Further, in the peripheral region of the film layer which is separated from the pixel electrode, a larger part of each of the peripheral portions located at two ends of the accommodation groove in the length direction of the accommodation groove may be separated from the pixel electrode, thereby further reducing a width of the dark regions close to the short sides of the film layer of the light emitting unit. Thus, uniformity of light emitted from the light emitting unit is increased, and the display effect of the display device is improved.

It should be understood that, the foregoing embodiments are merely exemplary embodiments used for explaining the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. An organic light emitting display substrate, comprising a substrate, a first pixel defining layer provided on the substrate and a second pixel defining layer provided on the first pixel defining layer, wherein the first pixel defining layer includes a plurality of first openings, the second pixel defining layer includes a plurality of second openings in one-to-one correspondence with the plurality of first openings, an edge of each of the plurality of second openings extends outwards beyond an edge of the corresponding first opening so as to expose a portion of the first pixel defining layer, and a difference in length between each of the plurality of second openings and the corresponding first opening is greater than a difference in width between the second opening and the corresponding first opening; and wherein the portion of the first pixel defining layer exposed by each of the plurality of second openings includes two first exposed portions located at two ends of the corresponding first opening in a length direction of the corresponding first opening, respectively, and two second exposed portions located at two ends of the corresponding first opening in a width direction of the corresponding first opening, respectively, wherein one of the two first exposed portions has a size in the length direction of the corresponding first opening greater than a size of the other of the two first exposed portions in the length direction of the corresponding first opening.

2. The organic light emitting display substrate according to claim 1, wherein the one of the two first exposed portions has a size in the length direction of the corresponding first opening greater than a size of any one of the two second exposed portions in the width direction of the corresponding first opening, and the other of the two first exposed portions has a size in the length direction of the corresponding first opening not less than the size of any one of the two second exposed portions in the width direction of the corresponding first opening.

3. The organic light emitting display substrate according to claim 2, wherein each of the two second exposed portions has a width ranging from 4 μm to 5 μm.

4. The organic light emitting display substrate according to claim 3, wherein the first pixel defining layer includes a hydrophilic material, and the second pixel defining layer includes a hydrophobic material.

5. The organic light emitting display substrate according to claim 3, wherein the second pixel defining layer has a thickness greater than that of the first pixel defining layer.

6. The organic light emitting display substrate according to claim 2, further comprising a plurality of thin film transistors provided on the substrate, a passivation layer covering the plurality of thin film transistors and an electrode layer provided on the passivation layer, wherein the plurality of thin film transistors, the passivation layer and the electrode layer are all located between the first pixel defining layer and the substrate, the electrode layer includes a plurality of pixel electrodes, each of the plurality of first openings corresponds to one of the plurality of pixel electrodes and one of the plurality of thin film transistors, a via is provided in the passivation layer, and each of the plurality of pixel electrodes is connected to a drain electrode of the corresponding thin film transistor through the via; and wherein the via is located within an orthogonal projection region of one of the two first exposed portions onto the passivation layer.

7. The organic light emitting display substrate according to claim 6, wherein the first pixel defining layer includes a hydrophilic material, and the second pixel defining layer includes a hydrophobic material.

8. The organic light emitting display substrate according to claim 6, wherein the second pixel defining layer has a thickness greater than that of the first pixel defining layer.

9. The organic light emitting display substrate according to claim 2, wherein the first pixel defining layer includes a hydrophilic material, and the second pixel defining layer includes a hydrophobic material.

10. The organic light emitting display substrate according to claim 2, wherein the second pixel defining layer has a thickness greater than that of the first pixel defining layer.

11. The organic light emitting display substrate according to claim 1, wherein the first pixel defining layer includes a hydrophilic material, and the second pixel defining layer includes a hydrophobic material.

12. The organic light emitting display substrate according to claim 1, wherein the second pixel defining layer has a thickness greater than that of the first pixel defining layer.

13. A display device, comprising the organic light emitting display substrate according to claim 1.

14. The organic light emitting display substrate according to claim 1, further comprising a light emitting layer at least partially in contact with the second pixel defining layer.

15. A manufacturing method of an organic light emitting display substrate, comprising steps of:
    forming a first pixel defining material layer;
    performing a patterning process on the first pixel defining material layer, so as to form a first pixel defining layer including a plurality of first openings;
    forming a second pixel defining material layer; and
    performing a patterning process on the second pixel defining material layer so as to form a second pixel defining layer including a plurality of second openings, wherein the plurality of second openings are in one-to-one correspondence with the plurality of first openings, an edge of each of the plurality of second openings extends outwards beyond an edge of the corresponding first opening so as to expose a portion of the first pixel defining layer, and a difference in length between each of the plurality of second openings and the corresponding first opening is greater than a difference in width between the second opening and the corresponding first opening; and wherein the portion of the first pixel defining layer exposed by each of the plurality of second openings includes two first exposed portions located at two ends of the corresponding first opening in a length direction of the corresponding first opening, respectively, and two second exposed portion located at two ends of the corresponding first opening in a width direction of the corresponding first opening, respectively, wherein one of the two first exposed portions has a size in the length direction of the corresponding first opening greater than a size of the other the two first exposed portions in the length direction of the corresponding first openings.

16. The manufacturing method according to claim 15, wherein the one of the two first exposed portions has a size in the length direction of the corresponding first opening greater than a size of any one of the two second exposed portions in the width direction of the corresponding first opening, and the other of the two first exposed portions has a size in the length direction of the corresponding first opening not less than the size of any one of the two second exposed portions in the width direction of the corresponding first opening.

17. The manufacturing method according to claim 16, wherein each of the two second exposed portions has a width ranging from 4 μm to 5 μm.

18. The manufacturing method according to claim 16, wherein prior to the step of forming a first pixel defining material layer, the manufacturing method further comprises steps of:
    forming a plurality of thin film transistors, the plurality of thin film transistors being in one-to-one correspondence with the plurality of first openings; and
    forming a passivation layer with a via therein, the via being located within an orthogonal projection region of one of the two first exposed portions onto the passivation layer.

19. The manufacturing method according to claim 15, wherein the first pixel defining material layer includes a hydrophilic material, and the second pixel defining material layer includes a hydrophobic material.

20. The manufacturing method according to claim 15, wherein the second pixel defining material layer has a thickness greater than that of the first pixel defining material layer.

* * * * *